US011889626B2

(12) United States Patent
Lee et al.

(10) Patent No.: US 11,889,626 B2
(45) Date of Patent: Jan. 30, 2024

(54) INTERPOSER AND ELECTRONIC DEVICE INCLUDING THE SAME

(71) Applicant: Samsung Electronics Co., Ltd., Suwon-si (KR)

(72) Inventors: Kyungho Lee, Suwon-si (KR); Yunoh Chi, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 16 days.

(21) Appl. No.: 17/679,735

(22) Filed: Feb. 24, 2022

(65) Prior Publication Data
US 2022/0304156 A1    Sep. 22, 2022

Related U.S. Application Data

(63) Continuation of application No. PCT/KR2022/002131, filed on Feb. 14, 2022.

(30) Foreign Application Priority Data

Mar. 17, 2021 (KR) .................. 10-2021-0034532

(51) Int. Cl.
*H05K 1/14* (2006.01)
*H05K 1/11* (2006.01)
*H05K 3/00* (2006.01)

(52) U.S. Cl.
CPC ............ *H05K 1/144* (2013.01); *H05K 1/113* (2013.01); *H05K 3/0047* (2013.01);
(Continued)

(58) Field of Classification Search
CPC ...... H05K 1/144; H05K 1/113; H05K 3/0047; H05K 2201/042; H05K 2201/09027; H05K 2201/09063
(Continued)

(56) References Cited

U.S. PATENT DOCUMENTS 8,159,829 B2    4/2012  Mori et al.
8,913,395 B2 *  12/2014 Myers ................... G06F 1/1684
174/385

(Continued)

FOREIGN PATENT DOCUMENTS

JP      06-260226 A     9/1994
JP      2006-286660 A   10/2006
(Continued)

OTHER PUBLICATIONS

International Search Report dated Jun. 3, 2022, issued in International Patent Application No. PCT/KR2022/002131.

*Primary Examiner* — Andargie M Aychillhum
(74) *Attorney, Agent, or Firm* — Jefferson IP Law, LLP

(57) ABSTRACT

An electronic device is provided. The electronic device comprises an interposer disposed between first circuit board and second circuit board, and including an opening area and for accommodating the at least one electronic component, and the interposer comprises a board including an inner surface that faces the opening area and an outer surface that faces an opposite direction to the inner surface, wherein the outer surface is formed in a convexo-concave form having a plurality of first concave areas and a plurality of first concave areas, and a side conductive member disposed on the first concave areas and the first concave areas of the outer surface, and formed along the convexo-concave form of the outer surface.

20 Claims, 11 Drawing Sheets

(52) U.S. Cl.
CPC ............... *H05K 2201/042* (2013.01); *H05K 2201/09027* (2013.01); *H05K 2201/09063* (2013.01); *H05K 2201/09072* (2013.01); *H05K 2201/10378* (2013.01)

(58) Field of Classification Search
USPC ........................................................ 361/803
See application file for complete search history.

(56) References Cited

U.S. PATENT DOCUMENTS

| | | |
|---|---|---|
| 9,480,158 B2 | 10/2016 | Lee et al. |
| 10,342,131 B1 | 7/2019 | Kim et al. |
| 10,709,043 B2 | 7/2020 | Yun et al. |
| 11,277,949 B2 | 3/2022 | Yun et al. |
| 2009/0268423 A1* | 10/2009 | Sakurai ............... H05K 1/144 361/803 |
| 2009/0321122 A1 | 12/2009 | Mori et al. |
| 2016/0147093 A1* | 5/2016 | Zhong ............... G02F 1/133707 349/43 |
| 2017/0179325 A1* | 6/2017 | Chung ............... H01L 31/0682 |
| 2019/0313529 A1 | 10/2019 | Kim et al. |
| 2022/0005757 A1 | 1/2022 | Oh et al. |
| 2022/0210957 A1 | 6/2022 | Yun et al. |

FOREIGN PATENT DOCUMENTS

| | | | | |
|---|---|---|---|---|
| JP | 2006286660 A | * | 10/2006 | |
| KR | 10-2006-0091624 A | | 8/2006 | |
| KR | 10-2009-0054816 A | | 6/2009 | |
| KR | 10-2010-0018770 A | | 2/2010 | |
| KR | 10-1963273 B1 | | 3/2016 | |
| KR | 20200116414 A | * | 4/2019 | |
| KR | 10-2019-0125461 A | | 11/2019 | |
| KR | 10-2020-0032911 A | | 3/2020 | |
| KR | 10-2020-0053408 A | | 5/2020 | |
| KR | 10-2020-0116414 A | | 10/2020 | |

\* cited by examiner

INTERPOSER AND ELECTRONIC DEVICE INCLUDING THE SAME

CROSS-REFERENCE TO RELATED APPLICATION(S)

This application is a continuation application, claiming priority under § 365(c), of an International application No. PCT/KR2022/002131, filed on Feb. 14, 2022, which is based on and claims the benefit of a Korean patent application number 10-2021-0034532, filed on Mar. 17, 2021, in the Korean Intellectual Property Office, the disclosure of which is incorporated by reference herein in its entirety.

TECHNICAL FIELD

The disclosure relates to an interposer and an electronic device including the same.

BACKGROUND

In recent years, as various functions have been added to electronic devices, a larger number of electric elements may be mounted in boards in interiors of the electronic devices. As the electronic devices have become gradually smaller, mounting spaces of the boards may become insufficient. To efficiently utilize the inefficient mounting spaces, a recent electronic device includes two or more printed circuit boards that are stacked. Then, the electronic device may include an interposer for electrically connecting two or more stacked printed circuit boards. The interposer may provide an electrical path between the two printed circuit boards through conductive vias (or pads) formed in via holes that pass through the interposer.

The interposer may be formed by forming via holes in a disk through a drilling process, forming conductive vias in the via holes, and machining the disk according to the size of a product through a router process. An external appearance of the interposer may be formed through the router process. Because a slit space of a minimum width of 1.6 mm is lost in the disk according to the external appearance during the router process, it is difficult to increase the number of finished products.

Various embodiments of the disclosure provide an interposer that may increase the number of finished products, and an electronic device including the same.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide an interposer including an opening area for accommodating at least one electronic component may include a board including an inner surface that faces the opening area and an outer surface that faces an opposite direction to the inner surface, wherein the outer surface is formed in a convexo-concave form having a plurality of first concave areas and a plurality of first convex areas, and a side conductive member disposed on the first concave areas and the first convex areas of the outer surface, and formed along the convexo-concave form of the outer surface.

Additional aspects will be set forth in part in the description which follows and, in part, will be apparent from the description, or may be learned by practice of the presented embodiments.

In accordance with an aspect of the disclosure, an electronic device is provided. The electronic device includes a first circuit board and a second circuit board disposed in an interior of the electronic device, at least one electronic component mounted on at least any one of the first circuit board and the second circuit board, and an interposer disposed between the first circuit board and the second circuit board, and including an opening area and for accommodating the at least one electronic component, and the interposer includes a board including an inner surface that faces the opening area and an outer surface that faces an opposite direction to the inner surface, wherein the outer surface is formed in a convexo-concave form having a plurality of first concave areas and a plurality of first concave areas, and a side conductive member disposed on the first concave areas and the first concave areas of the outer surface, and formed along the convexo-concave form of the outer surface.

In accordance with another aspect of the disclosure, an electronic device is provided. The electronic device includes an interposer, in which an outer surface and an inner surface are formed to be a convexo-concave form through a drilling process. Accordingly, spacing distances between the outer surface and the inner surface of the interposer and the conductive vias may be reduced to a minimum of about 150 μm, and a width of a slit space lost during a drilling process may be reduced to a maximum of about 0.5 mm.

Furthermore, according to embodiments disclosed in the disclosure, because the spacing distance between the outer surface and the inner surface of the interposer and the conductive vias, and the width of the slit space are reduced, the number of finished products may be increased and cost may be improved.

Furthermore, embodiments disclosed in the disclosure may include a side conductive member formed in a convexo-concave form along the outer surface and the inner surface of the convexo-concave form. Through the side conductive member, electromagnetic waves radiated toward the inner surface of the interposer and electromagnetic waves introduced through the outer surface may be shielded.

In addition, the disclosure may provide various effects that are directly or indirectly recognized.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
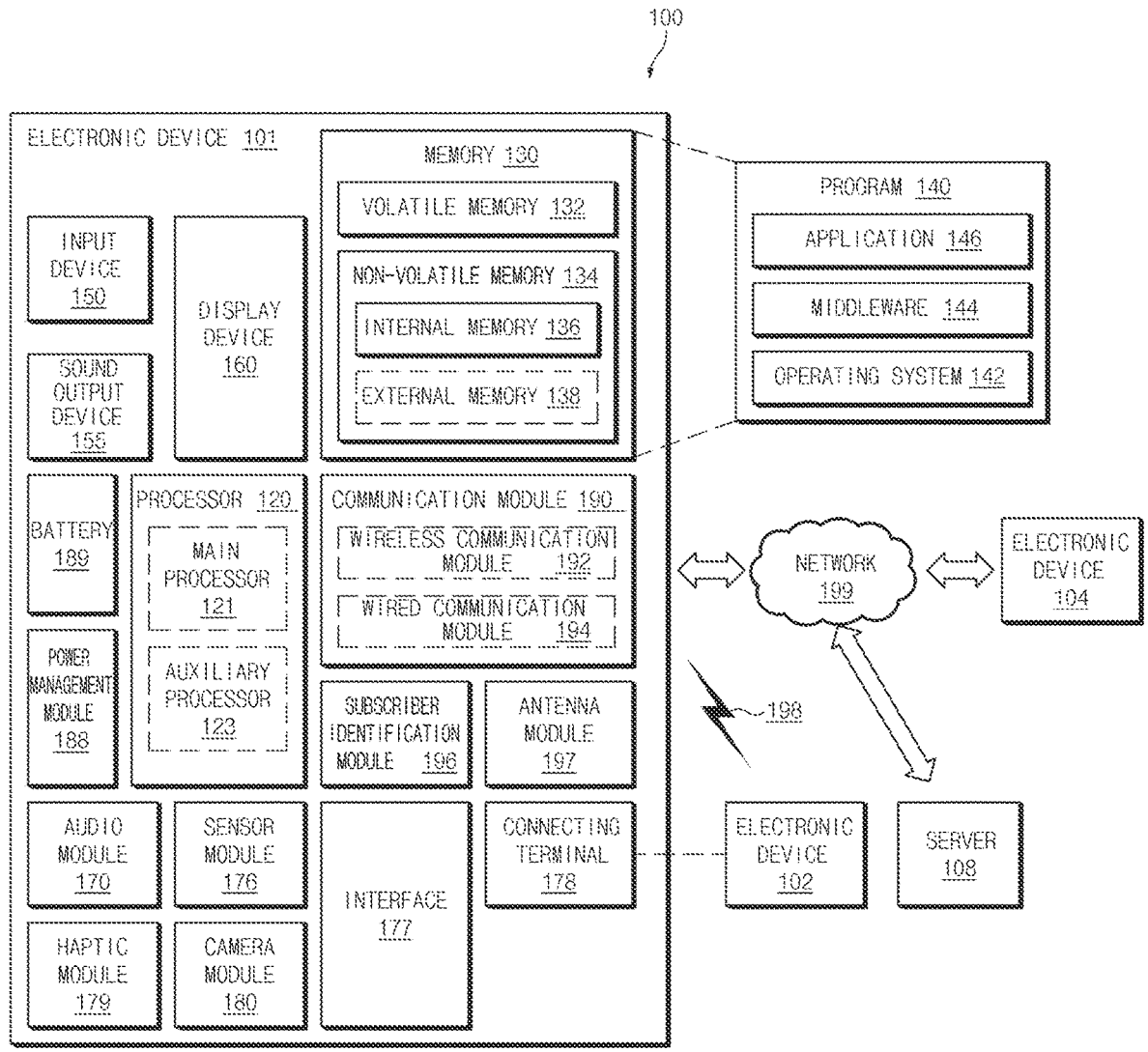
FIG. 1 is a block diagram illustrating an electronic device in a network environment according to an embodiment of the disclosure.

FIG. 1 is a block diagram illustrating an electronic device in a network environment according to an embodiment of the disclosure.

Referring to FIG. 1, an electronic device 101 in a network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134. The memory 130 may include internal memory 136 or external memory 138.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™ wireless-fidelity (Wi-Fi) direct, or infrared data association (IrDA)) or the second network 199 (e.g., a long-range communication network, such as a cellular network, the Internet, or a computer network (e.g., LAN or wide area network (WAN))). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example. The electronic device 101 may provide ultra low-latency services using, e.g., distributed computing or mobile edge computing. In another embodiment, the external electronic device #04 may include an internet-of-things (IoT) device. The server 108 may be an intelligent server using machine learning and/or a neural network. According to an embodiment, the external electronic device #04 or the server 108 may be included in the second network 199. The electronic device #01 may be applied to intelligent services (e.g., smart home, smart city, smart car, or healthcare) based on 5G communication technology or IoT-related technology.

An electronic device according to various embodiments disclosed in the disclosure may include devices of various forms. The electronic devices, for example, may include a portable communication device (e.g., a smart phone), a computer device, a portable multimedia device, a portable medical device, a camera, a wearable device, or a home appliance. An electronic device according to various embodiments of the disclosure is not limited to the above-mentioned devices.

Figure 2:
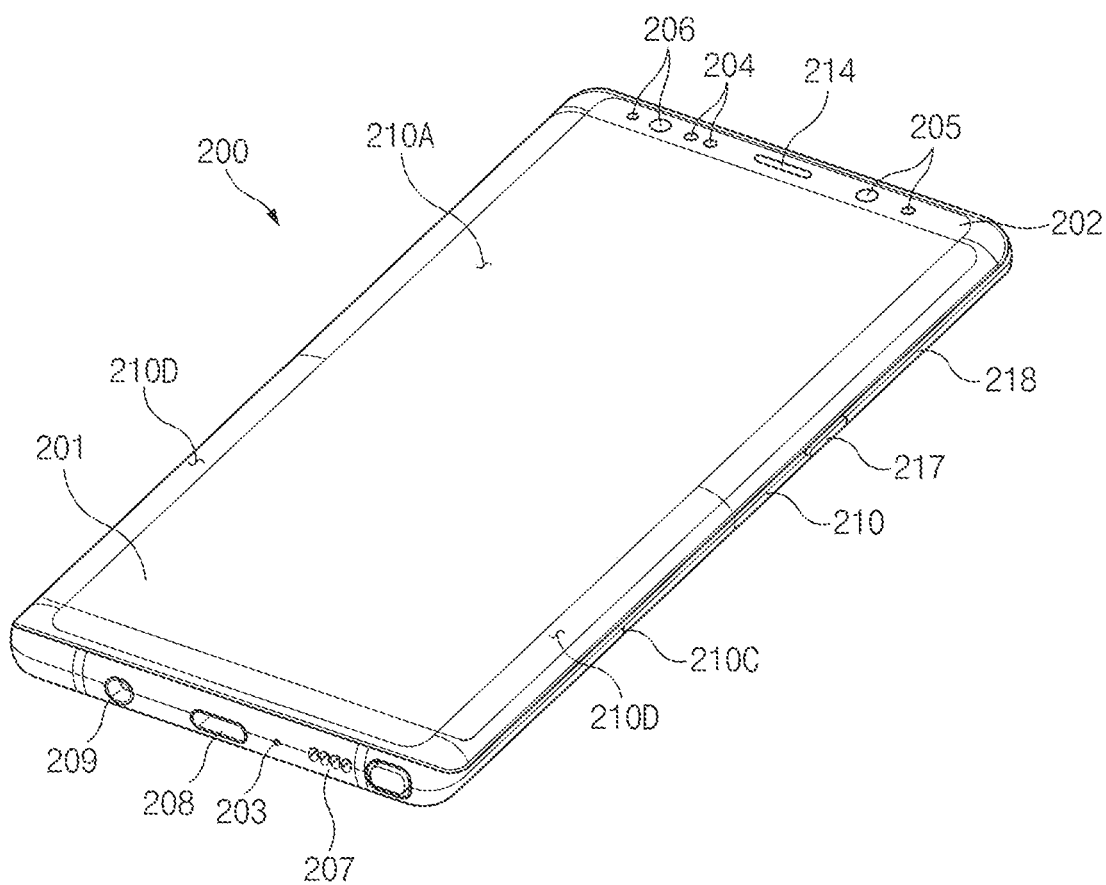
FIG. 2 illustrates a perspective view illustrating a front surface of an electronic device according to an embodiment of the disclosure.

FIG. 2 is a perspective view of a front surface of an electronic device (e.g., an electronic device of FIG. 1) according to an embodiment of the disclosure.

Figure 3:
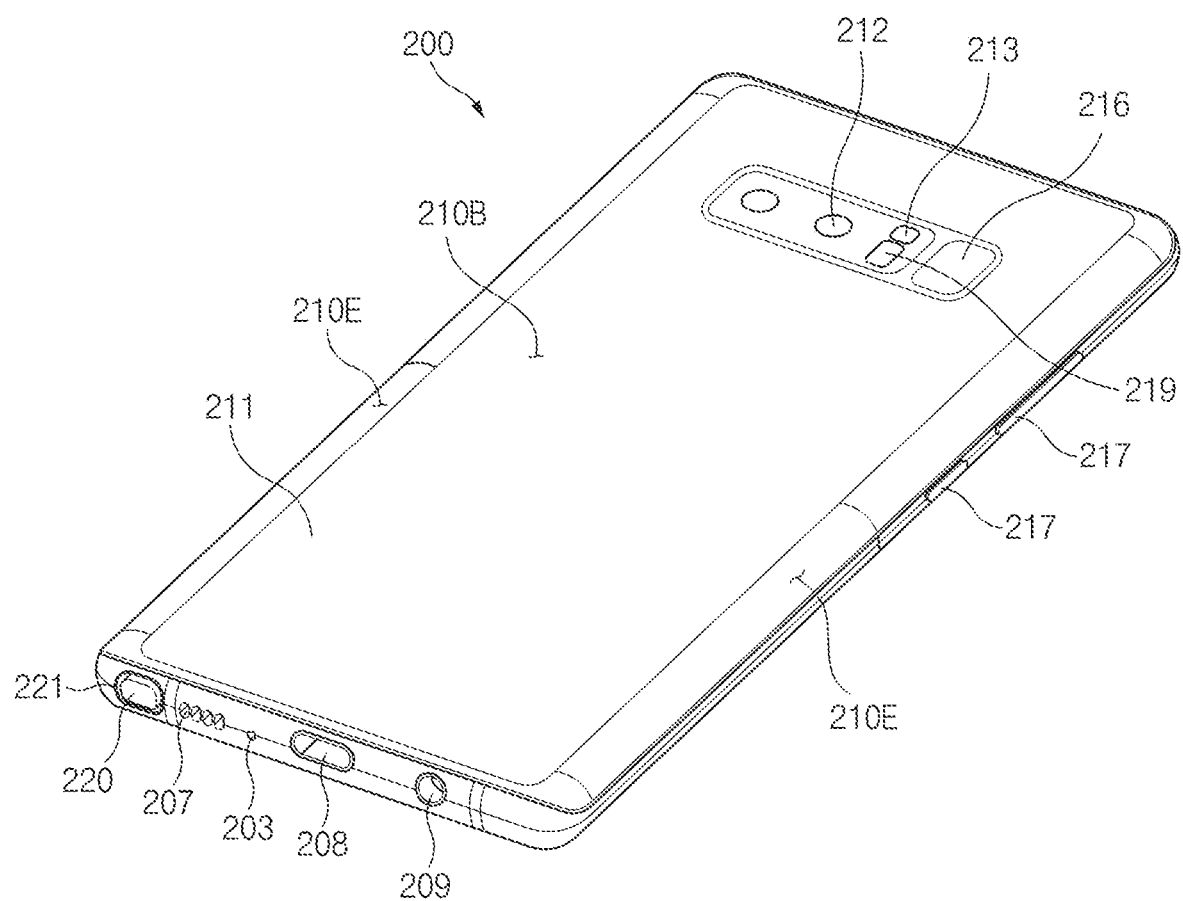
FIG. 3 illustrates a perspective view illustrating a rear surface of an electronic device according to an embodiment of the disclosure.

FIG. 3 is a perspective view of a rear surface of an electronic device according to an embodiment of the disclosure.

Referring to FIGS. 2 and 3, an electronic device 200 according to an embodiment may include a housing 210 including a first surface (or a front surface) 210A, a second surface (or a rear surface) 210B, and a side surface 210C that surrounds a space between the first surface 210A and the second surface 210B. In another embodiment (not illustrated), the housing may refer to a structure that defines some of the first surface 210A, the second surface 210B, and the side surface 210C of FIG. 2. According to an embodiment, the first surface 210A may be defined by a front plate 202 (e.g., a glass plate or a polymer plate including various coating layers), at least a portion of which is substantially transparent. The second surface 210B may be defined by a substantially opaque rear plate 211. The rear plate 211, for example, may be formed of coated or colored glass, ceramics, a polymer, a metal (e.g., aluminum, stainless steel (STS), or magnesium), or a combination of at least two thereof. The side surface 210C may be coupled to the front plate 202 and the rear plate 211, and may be defined by a side bezel structure (or 'a side member') 218 including a metal and/or a polymer. In some embodiments, the rear plate 211 and the side bezel structure 218 may be integrally formed and may include the same material (e.g., a metallic material such as aluminum).

In the illustrated embodiment, the front plate 202 may include two first areas 210D that are deflected from the first surface 210A toward the rear plate 211 and extend seamlessly, at opposite ends of a long edge of the front plate 202. In the illustrated embodiment (see FIG. 3), the rear plate 211 may include two second areas 210E that are deflected from the second surface 210B toward the front plate 202 and extend seamlessly, at opposite ends of a long edge of the rear plate 211. In some embodiments, the front plate 202 (or the rear plate 211) may include only one of the first areas 210D (or the second areas 210E). In other embodiments, some of the first areas 210D or the second areas 210E may not be included. In the embodiments, when viewed from a side of the electronic device 200, the side bezel structure 218 may have a first thickness (width) on a side surface, on which neither the first areas 210D nor the second areas 210E are included, and may have a second thickness that is smaller than the first thickness on a side surface, on which the first areas 210D or the second areas 210E are included.

In an embodiment, at least one antenna radiator (e.g., a conductive pattern) may be disposed in the side member (e.g., the side bezel structure 218 of FIG. 3) of the housing 210 of the electronic device 200, the two first areas 210D deflected from the first surface 210A of the front plate 302 toward the rear plate 211 and extending seamlessly, or the two areas (e.g., the first area 210D and the second area 210E) deflected from the second surface 210B of the rear plate 211 toward the front plate 202 and extending seamlessly.

In an embodiment, the first area 210D or the second area 210E may be planar to define substantially one plane with the first surface 210A or the second surface 210B without being deflected.

In an embodiment, at least one antenna radiator may radiate a signal of a specific frequency band. In an embodiment, at least one antenna radiator may be an auxiliary radiator. For example, the at least one antenna radiator may radiate a signal pertaining to a frequency band of about 700 MHz to about 3 GHz used for a legacy network. As another example, at least one antenna radiator may radiate a signal pertaining to a 5G Sub-6 frequency band of about 3.5 GHz to about 6 GHz, such as n41, n78, and/or n79. As another example, at least one antenna radiator may radiate a signal pertaining to a 5G Above-6 frequency band of about 6 GHz to about 60 GHz. As another example, at least one antenna radiator may radiate a frequency of a Wi-Fi frequency band and/or a Bluetooth frequency band. For example, the Wi-Fi frequency band may include a frequency band, such as 802.11a, 802.11b, 802.11g, 802.11n, and/or 802.11ac.

In an embodiment, at least one antenna radiator may be a main radiator. In an embodiment, some of frequency bands radiated by the main radiator and some frequency bands radiated by the auxiliary radiator may be the same, and the remaining ones thereof may be different.

In an embodiment, as another example, at least one antenna radiator may radiate a frequency of a mmWave frequency band. For example, the mmWave frequency band may include a frequency band of about 24 to 34 GHz and/or about 37 to 44 GHz, such as n257, n258, n260, and/or n261. As another example, at least one antenna radiator may radiate a frequency of a frequency band of 802.11ay.

According to an embodiment, the electronic device 200 may include at least one of the display 201 (e.g., the display device 160 of FIG. 1), the audio module 203, 207, and 214 (e.g., the audio module 170 of FIG. 1), the sensor module 204, 216, and 219 (e.g., the sensor module 176 of FIG. 1), the camera module 205 and 212 (e.g., the camera module 180 of FIG. 1), the key input device 217, the light emitting element 206, and the connector holes 208 and 209. In some embodiments, at least one (e.g., the key input device 217 or the light emitting element 206) of the elements may be omitted from the electronic device 200 or another component may be additionally included in the electronic device 200.

The display 201, for example, may be visually exposed through a corresponding portion of the front plate 202. In some embodiments, at least a portion of the display 201 may be exposed through the front plate 202 that defines the first surface 210A, and the first areas 210D and the second areas 210E of the side surface 210C. In some embodiments, corners of the display 201 may have a shape that is substantially the same as the adjacent outer shape of the front plate 202. In other embodiments (not illustrated), to expand the area, by which the display 201 is visually exposed, the intervals between the outskirts of the display 201 and the outskirts of the front plate 202 may be substantially the same.

In other embodiments (not illustrated), a portion of the screen display area of the display 201 may have a recess or an opening, and may include at least one of the audio module 214, the sensor module 204, the camera module 205, and the light emitting element 206, which are aligned with the recess or the opening. In other embodiments (not illustrated), at least one of the audio module 214, the sensor module 204, the camera module 205, the fingerprint sensor 216, and the light emitting element 206 may be included on the rear surface of the screen display area of the display 201. In other embodiments (not illustrated), the display 201 may be coupled to or be disposed to be adjacent to a touch detection circuit, a pressure sensor that may measure the intensity (the pressure) of a touch, and/or a digitizer that detects a stylus pen 220 of a magnetic field type. The stylus pen 220 may be guided into an interior of the housing 210 through a reception hole 221 formed in the housing 210 to be inserted or detached. In some embodiments, at least a portion of the sensor modules 204, 216, and 219 and/or at least a portion of the key input device 217 may be disposed in the first areas 210D and/or the second areas 210E. In another example, a partial area of a screen display area of the display 201 may include another pixel structure, another pixel density, and/or another wiring structure as compared with another area, and may include at least one of the audio module 214, the sensor module 204, the camera module 205, and the light emitting element 206 disposed at a location that is aligned with the partial area.

The audio modules 203, 207, 214 may include a microphone hole 203 and speaker holes 207 and 214. A microphone for acquiring external sounds may be disposed in the microphone hole 203, and in some embodiments, a plurality of microphones may be disposed to detect the direction of a sound. The speaker holes 207 and 214 may include an external speaker hole 207 and a communication receiver hole. In some embodiments, the speaker holes 207 and 214 and the microphone hole 203 may be implemented by one hole or a speaker may be included while a speaker hole 207 and 214 is not employed (e.g., a piezoelectric speaker).

The sensor modules 204, 216, and 219 may generate an electrical signal or a data value corresponding to an operational state of the interior of the electronic device 200 or an environmental state of the outside. The sensor modules 204, 216, and 219, for example, may include a first sensor module 204 (e.g., a proximity sensor) and/or a second sensor module (not illustrated) (e.g., a fingerprint sensor) disposed on the first surface 210A of the housing 210, and/or a third sensor module 219 (e.g., a HRM sensor) and/or a fourth sensor module 216 (e.g., a fingerprint sensor) disposed on the second surface 210B of the housing 210. The fingerprint sensor may be disposed not only on the first surface 210A (e.g., the display 201) but also on the second surface 210B of the housing 210. The electronic device 200 may further include a sensor module (not illustrated), for example, at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illumination sensor (e.g., first sensor module 204).

The camera modules 205 and 212 may include a first camera module 205 disposed on the first surface 210A of the electronic device 200, a second camera module 212 and/or a flash 213 disposed on the second surface 210B. The modules 205 and 212 may include one or a plurality of lenses, an image sensor, and/or an image signal processor. The flash 213, for example, may include a light emitting diode or a xenon lamp. In some embodiments, two or more lenses (an infrared ray camera or a wide angle/telephoto lens), and image sensors may be disposed on one surface of the electronic device 200.

The key input device 217 may be disposed on the side surface 210C of the housing 210. In another embodiment, the electronic device 200 may not include some or all of the above-mentioned key input devices 217, and the key input devices 217, which are not included, may be implemented in different forms, such as a soft key, on the display 201. In some embodiments, the key input device may include a sensor module 216 disposed on the second surface 210B of the housing 210.

The light emitting element 206, for example, may be disposed on the first surface 210A of the housing 210. The light emitting element 206, for example, may provide state information on the electronic device 200 in the form of light. In other embodiments, the light emitting element 206, for example, may provide a light source that interworks with an operation of the camera module 205. The light emitting element 206, for example, may include an LED, an IR LED, and/or a xenon lamp.

The connector holes 208 and 209 may include a first connector hole 208 that may accommodate a connector (e.g., a USB connector) for transmitting and receiving electric power and/or data to and from an external electronic device and/or a second connector hole (e.g., an earphone jack) 209 that may accommodate a connector for transmitting and receiving an audio signal to and from the external device.

Figure 4:
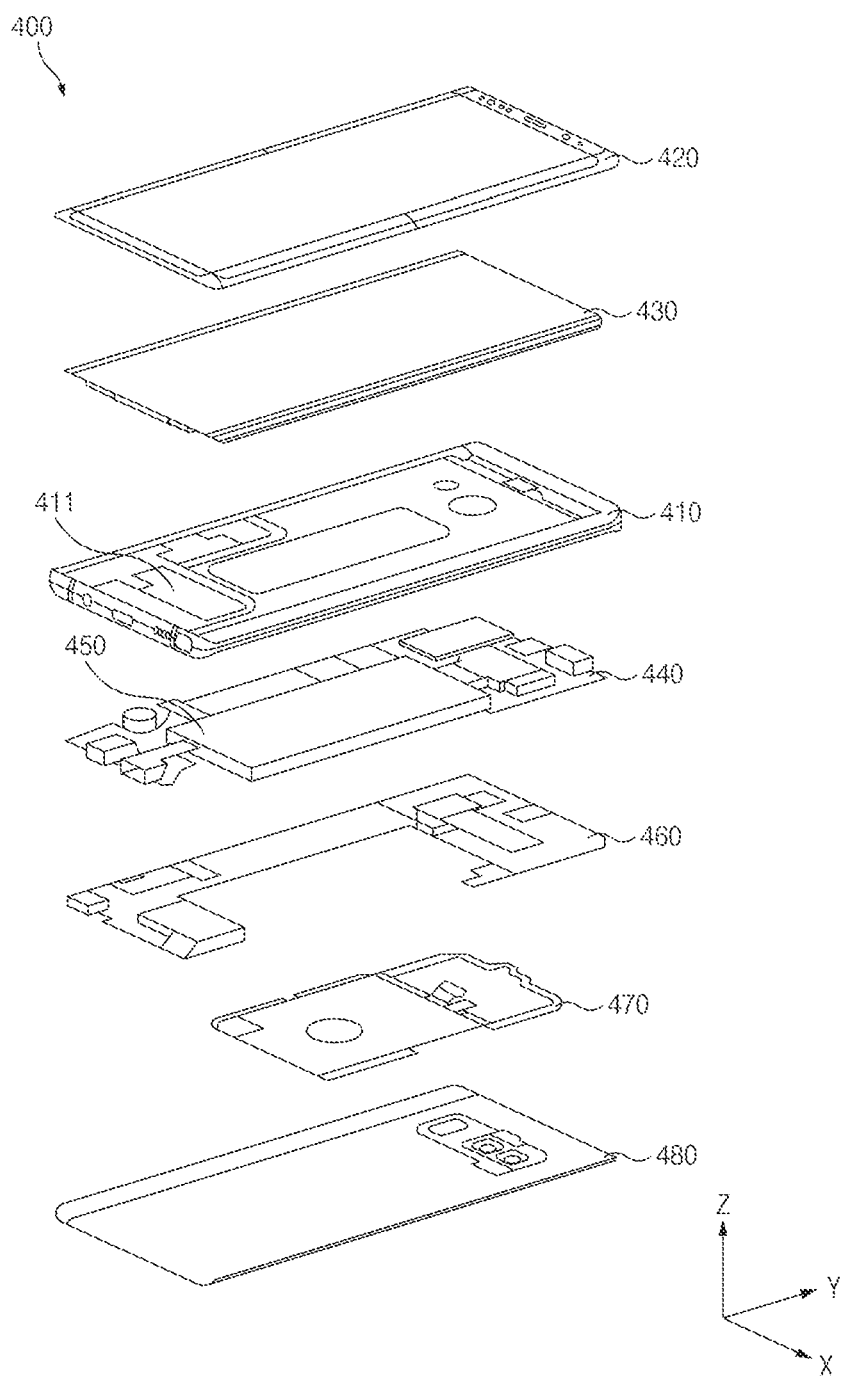
FIG. 4 illustrates an exploded perspective view illustrating an electronic device according to an embodiment of the disclosure.

FIG. 4 is an exploded perspective view of an electronic device (e.g., an electronic device of FIG. 2 and/or FIG. 3) according to an embodiment of the disclosure.

Referring to FIG. 4, an electronic device 400 may include a side bezel structure 410 (e.g., a side bezel structure 218 of FIG. 2), a first support member 411 (e.g., the bracket), a front plate 420, a display 430 (e.g., a display 201 of FIG. 2), a printed circuit board 440 (e.g., a printed circuit board (PCB), a printed board assembly (PBA), a flexible PCB (FPCB), or a rigid-flexible PCB (RFPCB)), a battery 450, a second support member 460 (e.g., a rear case), a short range antenna (470), and/or a rear plate 480 (e.g., a rear plate 211 of FIG. 3). In some embodiments, at least one (e.g., the first support member 411 or the second support member 460) of the elements may be omitted from the electronic device 200 or another component may be additionally included in the electronic device 101. At least one of the components of the electronic device 200 may be the same as or similar to at least one of the components of the electronic device 200 of FIG. 2 or 3, and a repeated description thereof will be omitted.

According to an embodiment, the side bezel structure 410 may include one or more conductive members that surround a space between the front plate 420 and the rear plate 480 of the electronic device 200 and are spaced apart from each other by a division part. For example, the side bezel structure 410 may include a plurality of conductive members that are spaced apart from each other by at least one division part. The electronic device 200 may include a structure that protrudes from at least on end and/or one point of the plurality of conductive members toward the interior of the housing (e.g., the housing 210 of FIG. 2).

For example, the electronic device 200 may include at least one connector that protrudes from at least one end and/or one point of the plurality of conductive members toward the interior of the housing and is physically connected to a support member (e.g., the first support member 411). As another example, the electronic device 200 may include a protrusion that protrudes from at least one end of the plurality of conductive members toward the interior of the housing and is electrically connected to at least one of the plurality of conductive members.

According to an embodiment, the first support member 411 may be disposed in a space between the front plate 420 and the rear plate 480. The first support member 411 may be disposed in the interior of the electronic device 200 to be connected to the side bezel structure 410 or to be integrally formed with the side bezel structure 410. The first support member 411, for example, may be formed of a metallic material and/or a nonmetallic material (e.g., a polymer). In an embodiment, the display 430 may be disposed on a first surface (e.g., one surface that faces the +z axis direction) of the first support member 411, and the printed circuit board 440 may be disposed on a second surface (e.g., one surface that faces the −z axis direction) that faces an opposite direction to the first surface.

According to an embodiment, a processor (e.g., the processor 120 of FIG. 1), a memory (e.g., the memory 130 of FIG. 1), an interface (e.g., the interface 177 of FIG. 1), an antenna module (e.g., the antenna module 197 of FIG. 1), and/or a wireless communication circuit (e.g., the wireless communication module 192 of FIG. 1) may be disposed in the printed circuit board 440. The processor 120, for example, may include one or more of a central processing unit (CPU), an application processor (AP), a graphics processing unit (GPU), an image signal processor (ISP), a sensor hub processor (SHP), or a communication processor (CP). The memory, for example, may include a volatile and/or nonvolatile memory. The interface, for example, may include a high definition multimedia interface (HDMI), a universal serial bus (USB), an SD card interface, and/or an audio interface. The interface, for example, may electrically or physically connect the electronic device 400 to an external electronic device (e.g., the electronic device 102 and 104 of FIG. 1), and may include a USB connector, an SD card/MMC connector, or an audio connector. The wireless communication circuit may be a radio frequency integrated circuit (RFIC). For example, the wireless communication circuit may feed an electrical signal to the protrusion formed at at least a portion of the housing.

The antenna module, for example, may include at least one patch antenna. The antenna module may be configured to radiate a frequency of a specific frequency band (e.g., a mmWave frequency band). For example, the antenna module may be electrically connected to the wireless communication circuit mounted on the printed circuit board 440. The antenna module may receive an electrical signal (e.g., a base band signal or an intermediate frequency (IF) signal) of a specific frequency band from the wireless communication circuit disposed in the printed circuit board 440. The antenna module may amplify the electrical signal received by using at least one circuit (e.g., an RFIC), and may provide electric power to at least one radiator included in the antenna module.

According to an embodiment, the battery 450 is a device for supplying electric power to at least one component of the electronic device 400, and for example, may include a primary battery that cannot be recharged, a secondary battery that may be recharged, or a fuel cell. At least a portion of the battery 450, for example, may be disposed substantially in parallel to the printed circuit board 440. The battery 450 may be integrally disposed in the interior of the electronic device 200, and may be disposed to be detachable from the electronic device 200.

According to an embodiment, the short range antenna 470 may be disposed between the rear plate 480 and the battery 450. The antenna 470, for example, may include a near field communication (NFC) antenna, a wireless charging antenna, and/or a magnetic secure transmission (MST) antenna. The antenna 470, for example, may perform short-range communication with an external device, or may wirelessly transmit and receive electric power that is necessary for charging. In another embodiment, an antenna structure may be formed by one or a combination of the side bezel structure 410 and/or the first support member 411.

Figure 5:
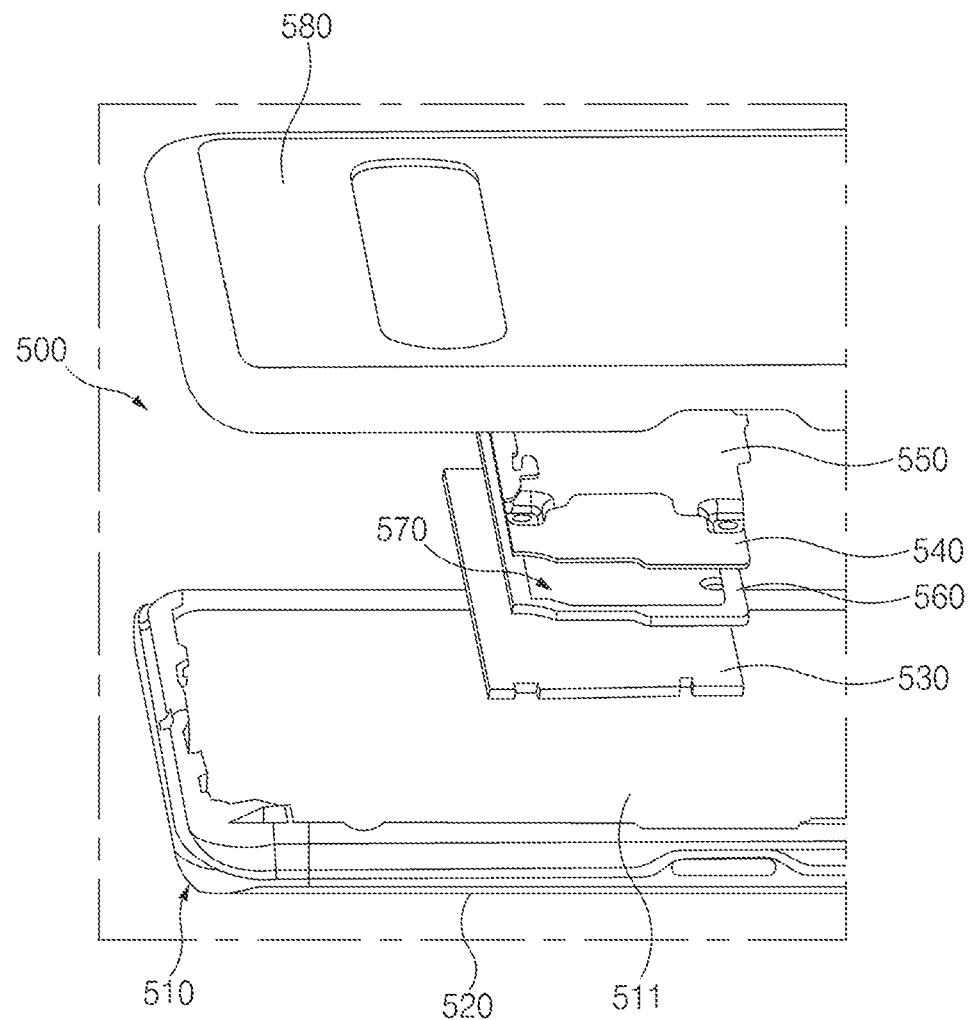
FIG. 5 is a view illustrating an electronic device including an interposer according to an embodiment of the disclosure.

FIG. 5 is a view illustrating an electronic device including an interposer according to an embodiment of the disclosure.

An electronic device 500 illustrated in FIG. 5 may include embodiments, in which an electronic device 500 is at least partially similar to or different from the electronic device 101 of FIG. 1, the electronic device 200 of FIGS. 2 and 3, or the electronic device 400 of FIG. 4.

Referring to FIG. 5, an electronic device 500 according to an embodiment may include a front plate 520 (e.g., a front plate 420 of FIG. 4), a rear plate 580 (e.g., a rear plate 480 of FIG. 4) that faces an opposite direction to a front plate 520, and a side bezel structure 510 (e.g., a side bezel structure 410 of FIG. 4) that surrounds a space between a front plate 520 and a rear plate 580.

According to an embodiment, the electronic device 500 may include a first support member 511 (e.g., the first support member 411 of FIG. 4) disposed in an interior space thereof. The first support member 511 may be disposed to extend from the side bezel structure 510 to the interior space, or may be separately provided in the interior space of the electronic device 500. The first support member 511 may extend from the side bezel structure 510, and at least a partial area thereof may be formed of a conductive material.

According to various embodiments, the electronic device 500 may include a pair of printed circuit boards 530 and 540 disposed between the first support member 511 and the rear plate 580 in the interior space. At least partial areas of the pair of printed circuit boards 530 and 540 may disposed to overlap each other when the front plate 520 is viewed from a top. The pair of printed circuit boards 530 and 540 may include a first printed circuit board 530 (e.g., a main board) disposed between the first support member 511 and the rear plate 580, and a second printed circuit board 540 (e.g., a sub board) disposed between the first printed circuit board 530 and the rear plate 580.

Electronic components of the electronic device may be disposed in at least any one of the first printed circuit board 530 and the second printed circuit board 540. For example, various electronic components of the electronic device, such as a processor, a memory, an antenna module, and a wireless communication circuit, may be disposed in at least any one of the first printed circuit board 530 and the second printed circuit board 540.

According to various embodiments, the electronic device 500 may include an interposer 560 interposed between the first printed circuit board 530 and the second printed circuit board 540. The interposer 560 may include an opening area 570 formed at a center thereof. The opening area 570 may be used as an accommodation space for accommodating electronic components disposed in at least any one of the first printed circuit board 530 and the second printed circuit board 540.

The interposer 560 may include a plurality of conductive vias (or pads). As the first printed circuit board 530 and the second printed circuit board 540 may physically contact each other through the conductive vias of the interposer 560, the interposer 560 may electrically connect the first printed circuit board 530 and the second printed circuit board 540. A signal generated by an electronic component mounted on any one of the first printed circuit board 530 and the second printed circuit board 540 may be delivered to an electronic component mounted on the other of the first printed circuit board 530 and the second printed circuit board 540 through the interposer 560.

According to an embodiment, the electronic device 500 may include a second support member 550 (e.g., the second support member 460 of FIG. 4) disposed between the second printed circuit board 540 and the rear plate 580. The second support member 550 may be disposed at a location, at which the second support member 550 at least partially overlaps the second printed circuit board 540. The second support member 550 may include a metal plate. Accordingly, the first printed circuit board 530, the interposer 560, and the second printed circuit board 540 may be fixed to the first support member 511 through the second support member 550. For example, as the second support member 550 is coupled to the first support member 511 through a coupling member such as a screw, an electrical connection between the first printed circuit board 530, the interposer 560, and the second printed circuit board 540 may be firmly supported.

Figure 6:
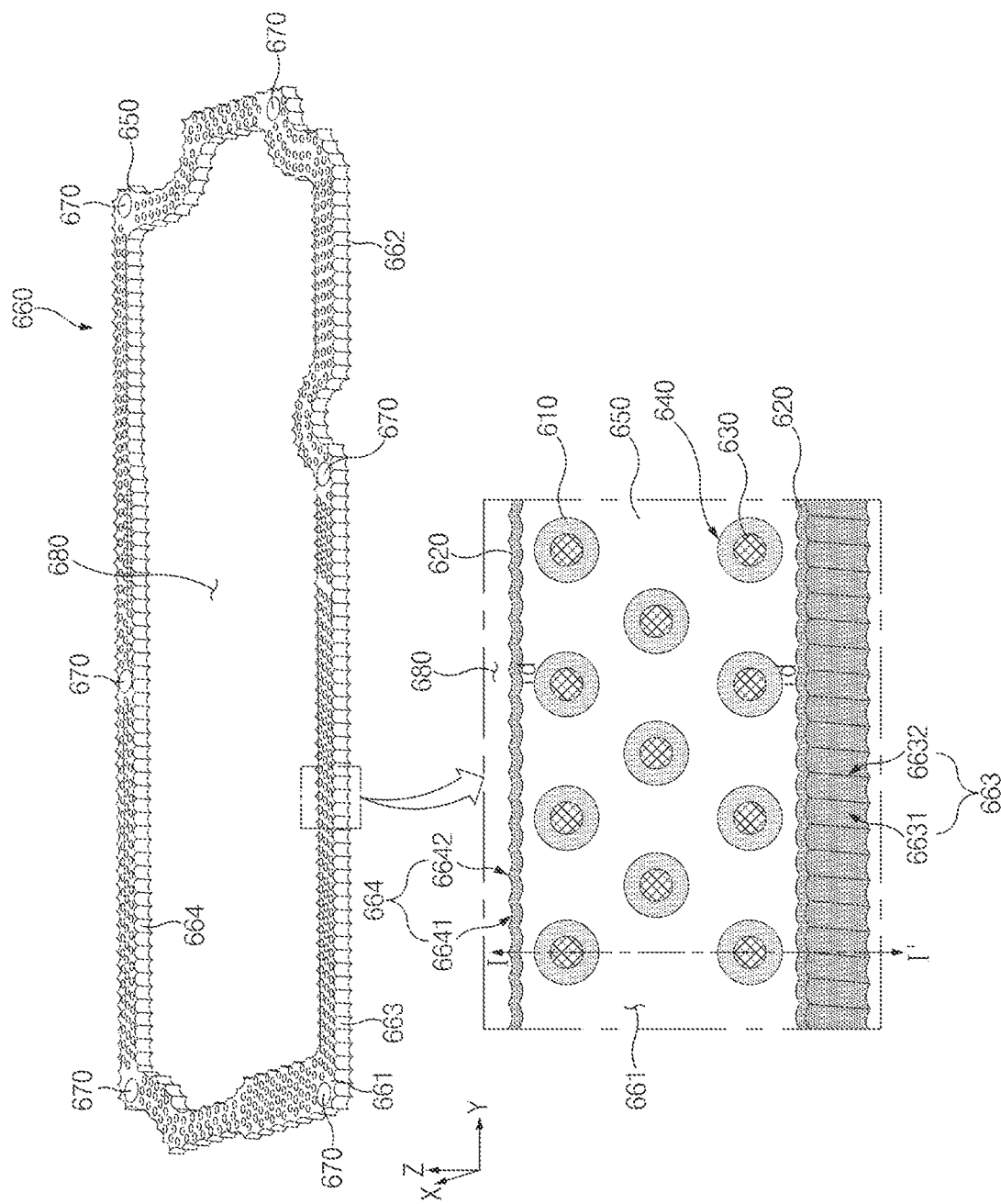
FIG. 6 is a perspective view illustrating an interposer connector according to an embodiment of the disclosure.

FIG. 6 is a view illustrating an interposer connector according to an embodiment of the disclosure.

Referring to FIG. 6, an interposer 660 (e.g., a interposer 560 of FIG. 5) according to various embodiments may include a dielectric board 650, a plurality of conductive vias 610, and a side conductive member 620.

The dielectric board 650 (or board) may include a first surface 661, a second surface 662, an inner surface 664, and an outer surface 663. The first surface 661 and the second surface 662 may face opposite directions. The first surface 661 may face any one of a forward direction (e.g., the +Z direction) that faces the first printed circuit board (e.g., the first printed circuit board 530 of FIG. 5) and a rearward direction (e.g., the −Z direction) that faces the second printed circuit board (e.g., the second printed circuit board 540 of FIG. 5). The second surface 662 may face the other of the forward direction that faces the first printed circuit board and the rearward direction that faces the second printed circuit board.

The inner surface 664 may be disposed to face the opening area 680, in which the electronic components are disposed. The outer surface 663 may be disposed to face an opposite direction to the inner surface 664. At least any one of the inner surface 664 and the outer surface 663 may be formed in a convexo-concave form. At least any one of the inner surface 664 and the outer surface 663 may be formed in a convexo-concave form through a drilling process. At least any one of the inner surface 664 and the outer surface 663 may have a plurality of concave areas and a plurality of convex areas. Hereinafter, a structure, in which each of the inner surface 664 and the outer surface 663 includes concave areas and convex areas, will be described as an example.

The outer surface 663 may include first concave areas 6631 and first convex areas 6632. The first concave areas 6631 and the first convex areas 6632 may be alternately disposed along at least one of a lengthwise direction (e.g., the +Y direction or the −Y direction) and a widthwise direction (e.g., the +X direction and the −X direction) of the dielectric board 650. The first concave areas 6631 may be formed between the first convex areas 6632 in an arc shape. Widths of the first concave areas 6631 may be smaller than or equal to at least any one of diameters of the plurality of via holes 640 and outer diameters of the plurality of conductive vias 610. The first concave areas 6631 may be formed to be concave toward the plurality of conductive vias 610. The first concave areas 6631 may be formed to be concave toward opening area 680. The first convex areas 6632 may protrude convexly to have an apex toward an opposite side to the first concave areas 6631. The first convex areas 6632 may be formed to be convex toward the opposite direction to the opening area 680.

The inner surface 664 may include second concave areas 6641 and second convex areas 6642. The second concave areas 6641 and the second convex areas 6642 may be alternately disposed along at least one of a lengthwise direction (e.g., the +Y direction or the −Y direction) and a widthwise direction (e.g., the +X direction and the −X direction) of the dielectric board 650. The second convex areas 6642 may be formed convexly to have an apex toward the opening area 680. The second concave areas 6641 may be formed between the second convex areas 6642 in an arc shape. The second concave areas 6641 may have widths that are the same as those of the first concave areas 6631. The second concave areas 6641 may be formed to be concave toward an opposite side to the second convex areas 6642. The second concave areas 6641 may be formed to be concave toward the plurality of conductive vias 610.

The plurality of via holes 640, in which the conductive vias 610 are buried respectively, may have a circular shape, an elliptical shape, or a polygonal shape. The plurality of via holes 640 may have the same size or different sizes. The plurality of via holes 640 may be disposed at an equal interval or unequal intervals. The plurality of via holes 640 may pass through the dielectric board 650, starting from the first surface 661 to the second surface 662.

The conductive vias 610 and filler members 630 may be buried in the plurality of via holes 640. The conductive vias 610 may be disposed on a side surface of the dielectric board 650 exposed through the via holes 640. The conductive vias 610 may be disposed to surround the filler members 630.

The filler members 630 may be disposed between the conductive vias 610, and thus may be disposed in interiors of the conductive vias 610.

The side conductive member 620 may be formed along at least any one of the inner surface 664 and the outer surface 663. For example, the side conductive member 620 may be formed in a convexo-concave form along the first concave areas 6631 and the first convex areas 6632 of the outer surface 663. The side conductive member 620 may be formed in a convexo-concave form along the second concave areas 6641 and the second convex areas 6642 of the inner surface 664.

The side conductive member 620 may have a specific thickness. The side conductive member 620 according to an embodiment may be formed on the first concave areas 6631 and the first convex areas 6632 of the outer surface 663 to have the same thickness. The side conductive member 620 according to another embodiment may be formed on the second concave areas 6641 and the second convex areas 6642 of the inner surface 664 to have the same thickness. Furthermore, the side conductive member 620 according to another embodiment may be formed on the first concave areas 6631, the first convex areas 6632, the second concave areas 6641, and the second convex areas 6642 to have the same thickness.

According to various embodiments, the interposer 660 may include at least one screw coupling part 670 disposed therein at least partially. The interposer 660 may be fixed to an interior of the electronic device (e.g., the electronic device 500 of FIG. 5) through the screw coupling part 670. For example, the interposer 660 may be fixed to at least one support structure (e.g., the first support member 511 of FIG. 5 and/or the second support member 550) disposed in the interior of the electronic device through the screw coupling part 670.

According to various embodiments, a specific clearance may be present between the side conductive member 620 and the conductive vias 610 to avoid interferences between the elements during a manufacturing process. At least one of a tolerance of the conductive vias 610, a tolerance of solder resist layers disposed around the conductive vias, and a drilling tolerance that is necessary during a drilling process may be present between the side conductive member 620 and the conductive vias 610. For example, a tolerance of the conductive vias 610 of about 50 μm, a tolerance of the solder resist layers disposed around the conductive vias 610 of about 50 μm, and a drilling tolerance of about 50 μm that is necessary during a drilling process of forming external appearances of the inner surface 664 and the outer surface 663 of the interposer 660 may be present between the side conductive member 620 and the conductive vias 610.

Accordingly, outer shapes of the side conductive member 620, the conductive vias 610, or the via holes 640 formed in the first concave areas 6631 of the outer surface 663 of the dielectric board 650 may be spaced apart from each other by a minimum of a distance "d" of about 150 μm. Outer shapes of the side conductive member 620, the conductive vias 610, or the via holes 640 formed in the second concave areas 6641 of the inner surface 664 of the dielectric board 650 may be spaced apart from each other by a minimum of a distance "d" of about 150 μm. For example, the outer shapes of the side conductive member 620, the conductive vias 610, or the via holes 640 formed in the first concave areas 6631 of the outer surface 663 of the dielectric board 650 may be spaced apart from each other by a minimum of a distance "d" of about 150 μm to about 250 μm. The outer shapes of the side conductive member 620, the conductive vias 610, or the via holes 640 formed in the first concave areas 6631 of the inner surface 664 of the dielectric board 650 may be spaced apart from each other by a minimum of a distance "d" of about 150 μm to about 250 μm.

Figure 7:
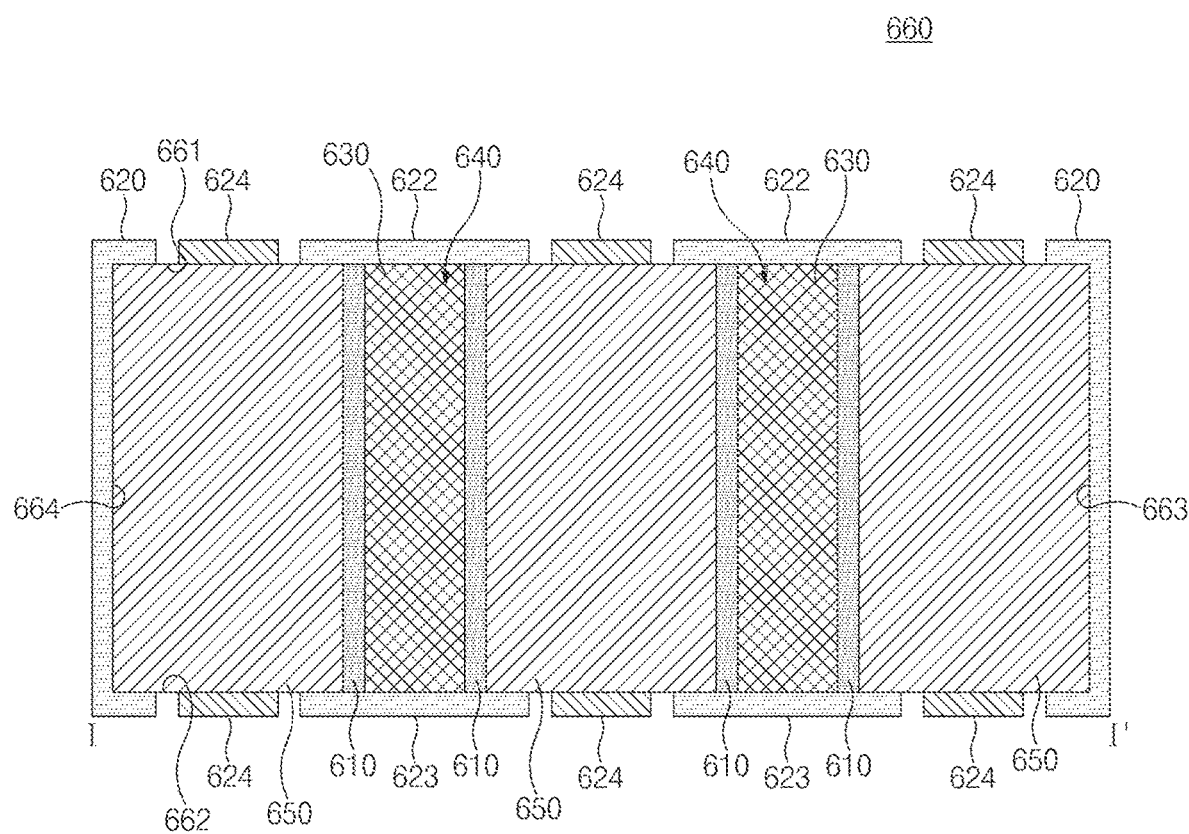
FIG. 7 is a cross-sectional view illustrating an interposer according to an embodiment of the disclosure.

FIG. 7 is a cross-sectional view illustrating an interposer, taken along line I-I of FIG. 6 according to an embodiment of the disclosure.

Referring to FIG. 7, an interposer 660 according to an embodiment may include a dielectric board 650, conductive vias 610, filler members 630, and a side conductive member 620.

The dielectric board 650 may be formed to have a plurality of via holes 640 that pass through the dielectric board 650, starting from the first surface 661 to the second surface 662. The plurality of via holes 640 may be disposed at an equal interval or unequal intervals.

The conductive vias 610 may be disposed in an interior of the dielectric board 650 exposed through the via holes 640 formed to pass the dielectric board 650. The conductive vias 610 may not protrude further than a first surface 661 and a second surface 662 of the dielectric board 650 but may define the same horizontal plane as the first surface 661 and the second surface 662 of the dielectric board 650.

The conductive vias 610 may electrically connect a plurality of pad members 622 and 623 exposed to the outside. For example, the conductive vias 610 may electrically connect the first pad member 622 disposed on the first surface 661 of the dielectric board 650 and a second pad member 623 disposed on the second surface 662 of the dielectric board 650. The first pad member 622 may be formed to contact the conductive vias 610 exposed through the first surface 661 of the dielectric board 650. The second pad member 623 may be formed to contact the conductive vias 610 exposed through the second surface 662 of the dielectric board 650.

Through the first pad member 622, the second pad member 623, and the conductive vias 610, a first printed circuit board (e.g., the first printed circuit board 530 of FIG. 5) may be electrically connected to a second printed circuit board (e.g., the second printed circuit board 540 of FIG. 5). For example, an electrical signal generated by electric components mounted on the first printed circuit board may be delivered to the conductive vias 610 through the first pad member 622. The electrical signal delivered to the conductive vias 610 may be delivered to a second electronic component of the second printed circuit board through the second pad member 623. A thickness of at least any one of the first pad member 622 and the second pad member 623 may be not less than a thickness of at least any one of the conductive vias 610 and the side conductive member 620.

The side conductive member 620 may be disposed on at least any one of the inner surface 664 and the outer surface 663 of the dielectric board 650. The side conductive member 620 may be disposed on a portion of on at least any one of the first surface 661 and the second surface 662 of the dielectric board 650.

For example, when a cross-section of the interposer 660, taken along line I-I of FIG. 6, is viewed, the side conductive member 620 have be formed in a "C" shape that surrounds the outer surface 663 of the dielectric board 650, a portion of the first surface 661, and a portion of the second surface 662. when a cross-section of the interposer 660, taken along line I-I of FIG. 6, is viewed, the side conductive member 620 have be formed in a "C" shape that surrounds the inner surface 664 of the dielectric board 650, a portion of the first surface 661, and a portion of the second surface 662. A thickness of the side conductive member 620 formed at a portion of the first surface 661 and a portion of the second surface 662 may be not less than a thickness of the side conductive member 620 formed on the outer surface 663 and the inner surface 664 of the dielectric board 650.

The side conductive member 620 may shield electromagnetic waves generated by electronic components disposed in a reception space provided by an opening area 680 of the interposer 660 and radiated toward the inner surface 664 of the interposer 660. Furthermore, the side conductive member 620 may shield electromagnetic waves generated on an outside of the interposer 660 and introduced through the outer surface 663 of the interposer 660.

In this way, the side conductive member 620 may shield electromagnetic waves that may be applied to an electrical signal that passes through the conductive vias 610 as a noise component. The side conductive member 620 may be formed of a conductive material, such as gold, copper, lead, or silver, to shield electromagnetic waves. The side conductive member 620 may be connected to a ground.

The filler members 630 may be filled in spaces between the conductive vias 610. The filler members 630 may be formed along outer walls of the conductive vias 610 formed in the via holes 640. The filler members 630 may be formed by filling an insulating material or a conductive material in a paste state or an ink state in a space between the conductive vias 610, and hardening the insulating material or the conductive material. The filler members 630 of the insulating material may prevent an electrical short-circuit between adjacent conductive vias 610.

According to various embodiments, the interposer 660 may include a solder resist layer 624 disposed on at least one of the first surface 661 and the second surface 662 of the dielectric board 650. The solder resist layer 624 may be formed in the remaining area, except for an area in which a solder is formed. The solder resist layer 624 may be disposed around at least any one of a first pad member 622 and a second pad member 623. The solder resist layer 624 may function to prevent a short-circuit of the conductive layers disposed in the interposer 660 and protect the conductive layers from an external impact, moisture, or contaminants as well.

Figure 8:
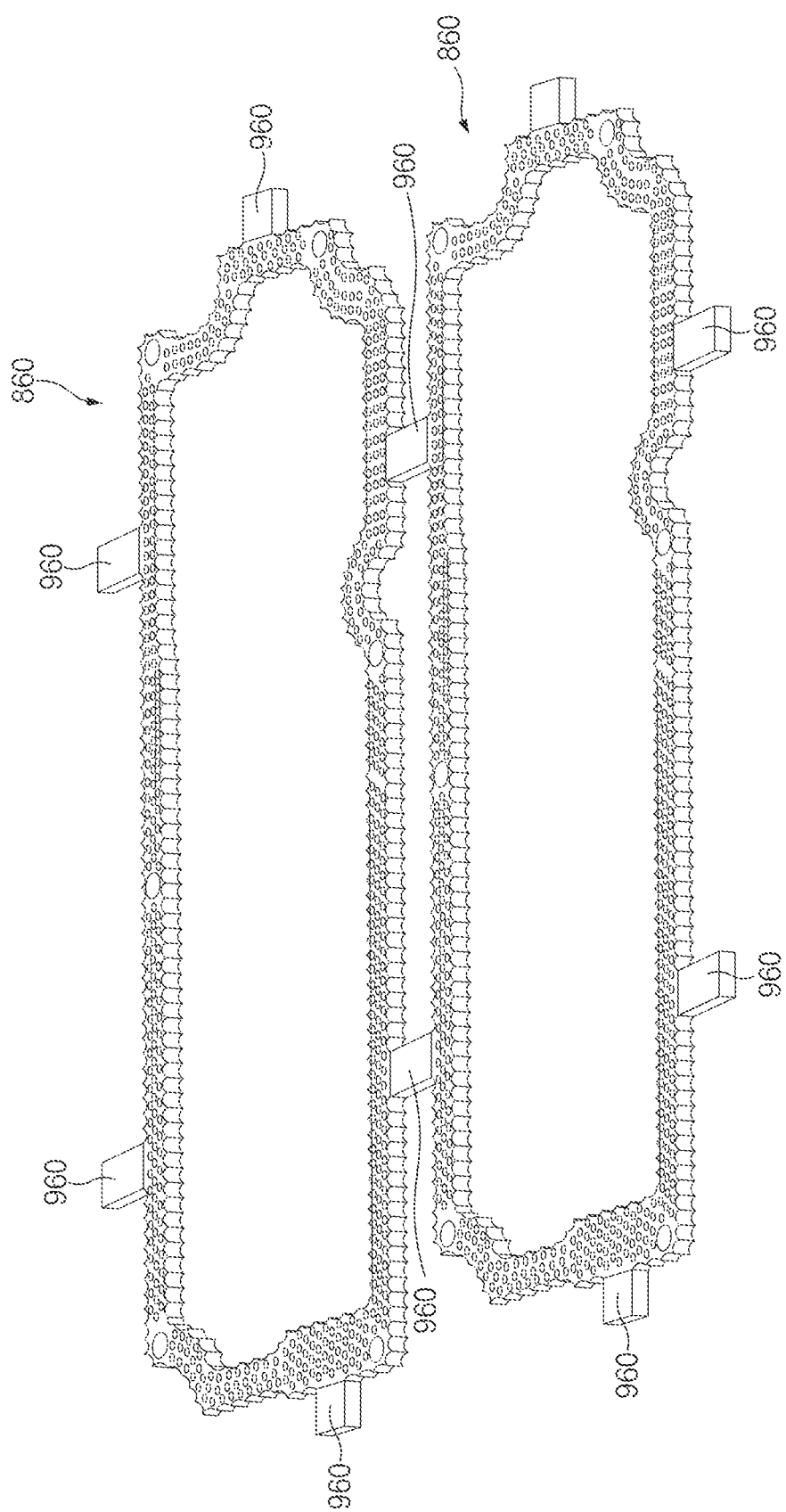
FIG. 8 is a view illustrating an interposer connected through a bridge according to an embodiment of the disclosure.

FIG. 8 is a view for explaining a method for manufacturing an interposer included in an electronic device according to an embodiment of the disclosure.

Figure 9:
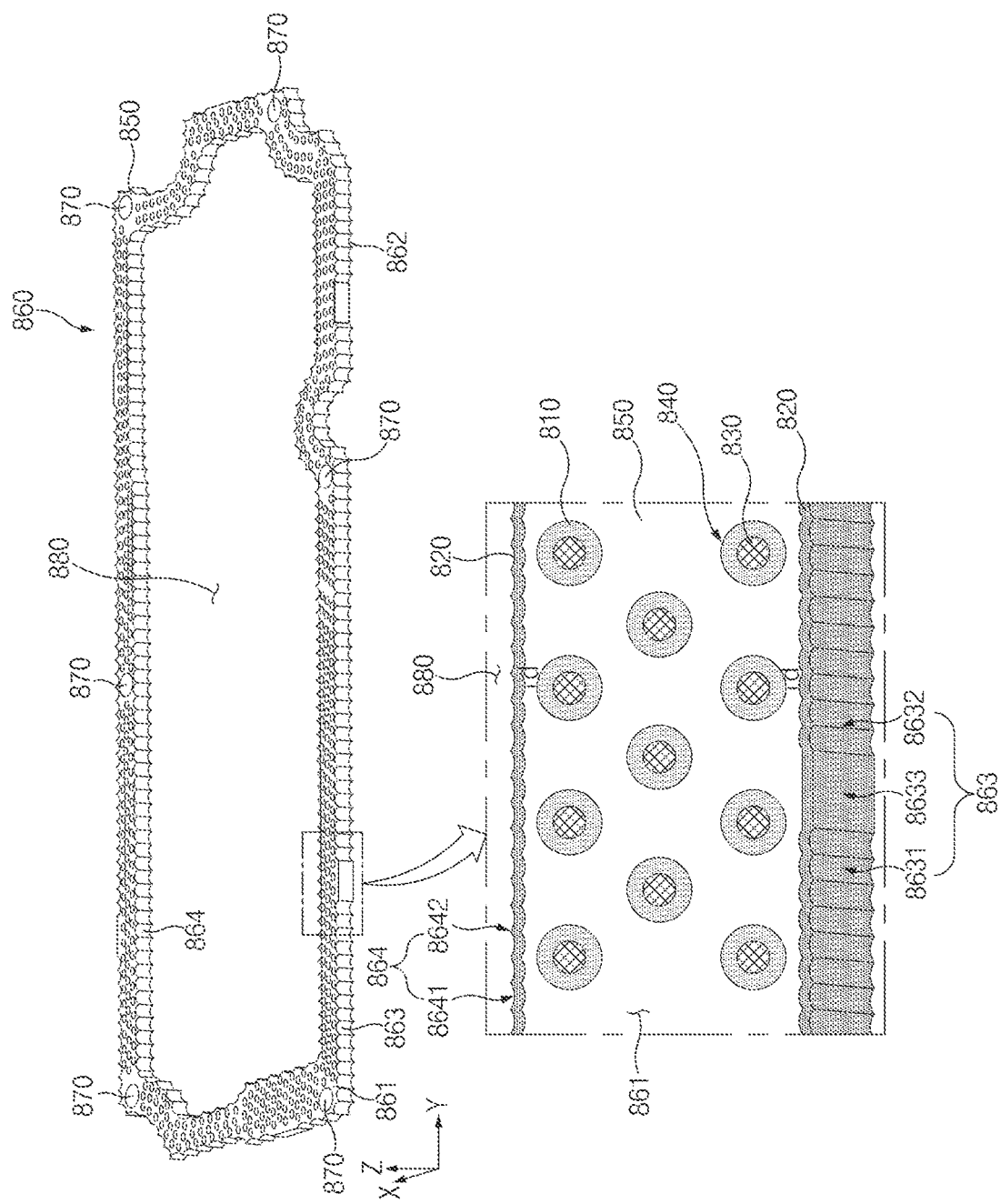
FIG. 9 is a view illustrating an interposer including an outer surface having a planar area according to an embodiment of the disclosure.

FIG. 9 is a view illustrating an interposer formed through a manufacturing method illustrated in FIG. 8 according to an embodiment of the disclosure.

Referring to FIGS. 8 and 9, an interposer 860 according to various embodiments may include a bridge 960 that is finally removed after being used in a manufacturing process. The bridge 960 may connect outer surfaces 863 of adjacent interposers 860. The bridge 960 may stably support the interposer 860 in a manufacturing process for the interposer 860 and move the interposer 860 to a next manufacturing process as well by connecting the outer surfaces 863 of the adjacent interposers 860.

The bridge 960 may be removed after at least any one of the outer surface 863 and the inner surface 864 of the interposer 860 is formed in a convexo-concave form. Accordingly, after the bridge 960 is removed, a convexo-concave form may not be formed in the outer surface 863 and the inner surface 864 of the interposer 860 corresponding to the bridge 960. For example, the outer surface 863 of the interposer 860, as illustrated in FIG. 9, may include first concave areas 8631, first convex areas 8632, and a first planar area 8633. The first planar area 8633 may be disposed in an area corresponding to the bridge 960 illustrated in FIG. 8. The first planar area 8633 may be disposed in a partial area of at least one of the four outer surfaces 863 of the interposer 860. The first planar area 8633 may be disposed between the first concave areas 8631, between the first convex areas 8632, or between the first concave areas 8631 and the first convex areas 8632. The first concave areas 8631 and the first convex areas 8632 may be alternately disposed in at least a partial area of the dielectric board 850, along at least one of a lengthwise direction (e.g., the +Y direction or the −Y direction) and a widthwise direction (e.g., the +X direction and the −X direction) of the dielectric board 850. The first concave areas 8631 may be formed between the first convex areas 8632 in an arc shape. Widths of the first concave areas 8631 may be smaller than at least any one of diameters of the plurality of via holes 840 and outer diameters of the plurality of conductive vias 810. The first concave areas 8631 may be formed to be concave toward the plurality of conductive vias 810. The first concave areas 8631 may be formed to be concave toward opening area 880. The first convex areas 8632 may protrude convexly to have an apex toward an opposite side to the first concave areas 8631. The first convex areas 8632 may be formed to be convex toward the opposite direction to the opening area 880.

The inner surface 864 (e.g., the inner surface 664 of FIGS. 6 and 7) may include second concave areas 8641 (e.g., the second concave areas 6641 of FIGS. 6 and 7) and second convex areas 8642 (e.g., the second convex areas 6642 of FIGS. 6 and 7). The second concave areas 8641 and the second convex areas 8642 may be alternately disposed along at least one of a lengthwise direction (e.g., the +Y direction or the −Y direction) and a widthwise direction (e.g., the +X direction and the −X direction) of the dielectric board 850. The second concave areas 8641 may be formed between the second convex areas 8642 in an arc shape. The second convex areas 8642 may be formed convexly to have an apex toward the opening area 880. The second concave areas 8641 may be formed to be concave toward an opposite side to the second convex areas 8642.

The plurality of via holes 840 (e.g., the via holes 640 of FIGS. 6 and 7), in which the conductive vias 810 (e.g., the conductive vias 610 of FIGS. 6 and 7) are buried, respectively, may have a circular shape, an elliptical shape, or a polygonal shape. The conductive vias 810 and the filler members 830 (e.g., the filler members 630 of FIGS. 6 and 7) may be buried in the plurality of via holes 840. The via holes 840 may pass through the dielectric board 850, starting from the first surface 861 to the second surface 862. The conductive vias 810 may be disposed on a side surface of the dielectric board 850 exposed through the via holes 840. The conductive vias 810 may be disposed to surround the filler members 830. The filler members 830 may be disposed between the conductive vias 810, and thus may be disposed in interiors of the conductive vias 810. The filler members 630 may be filled in spaces between the conductive vias 810. The filler members 830 may be formed by filling an insulating material or a conductive material in a paste state or an ink state in a space between the conductive vias 810, and hardening the insulating material or the conductive material. The filler members 830 of the insulating material may prevent an electrical short-circuit between adjacent conductive vias 810.

The side conductive member 820 (e.g., the side conductive member 620 of FIGS. 6 and 7) may be formed along at least one of the inner surface 864 and the outer surface 863. The side conductive member 820 may have a specific thickness. The side conductive member 820 may shield electromagnetic waves generated by electronic components disposed in a reception space provided by an opening area 880 of the interposer 860 and radiated toward the inner surface 864 of the interposer 860. Furthermore, the side conductive member 820 may shield electromagnetic waves generated on an outside of the interposer 860 and introduced through the outer surface 863 of the interposer 860. In this way, the side conductive member 820 may shield electromagnetic waves that may be applied to an electrical signal that passes through the conductive vias 810 as a noise component. The side conductive member 820 may be formed of a conductive material, such as gold, copper, lead, or silver, to shield electromagnetic waves.

According to various embodiments, the interposer 860 may include at least one screw coupling part 870 (e.g., the screw coupling part 670 of FIG. 6) disposed therein at least partially. The interposer 860 may be fixed to an interior of the electronic device (e.g., the electronic device 500 of FIG. 5) through the screw coupling part 870.

According to various embodiments, a specific clearance may be present between the side conductive member 820 and the conductive vias 810 to avoid interferences between the elements during a manufacturing process. Accordingly, outer shapes of the side conductive member 820, the conductive vias 810, or the via holes 840 formed in the first concave areas 8631 of the outer surface 863 of the dielectric board 850 may be spaced apart from each other by a minimum of a distance "d" of about 150 μm. Outer shapes of the side conductive member 820, the conductive vias 810, or the via holes 840 formed in the second concave areas 8641 of the inner surface 864 of the dielectric board 850 may be spaced apart from each other by a minimum of a distance "d" of about 150 μm. For example, outer shapes of the side conductive member 820, the conductive vias 810, or the via holes 840 formed in the first concave areas 8631 of the outer surface 863 of the dielectric board 850 may be spaced apart from each other by a minimum of a distance "d" of about 150 μm to about 250 μm. The outer shapes of the side conductive member 820, the conductive vias 810, or the via holes 840 formed in the second concave areas 8641 of the inner surface 864 of the dielectric board 850 may be spaced apart from each other by a minimum of a distance "d" of about 150 μm to about 250 μm.

Figure 10:
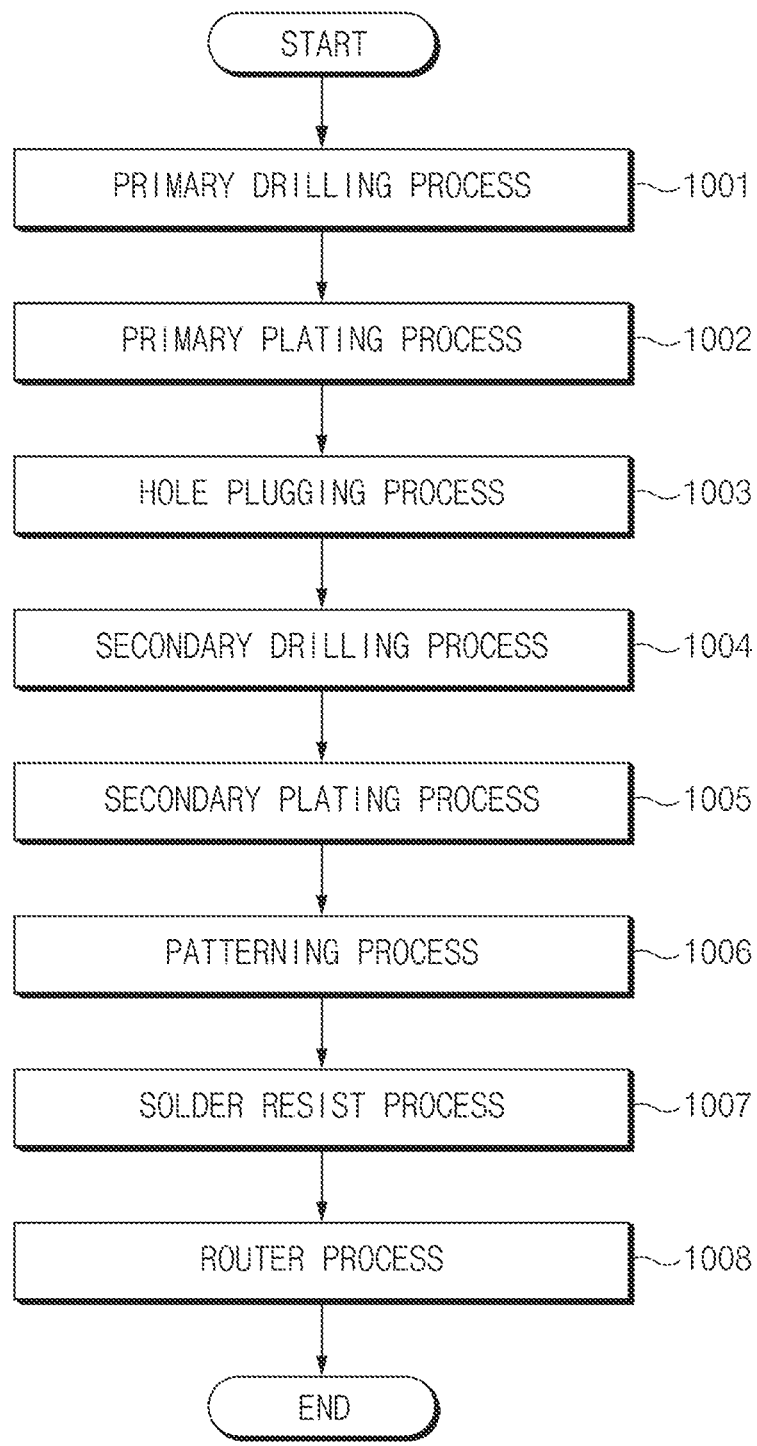
FIG. 10 is a flowchart for explaining a method for manufacturing an interposer according to an embodiment of the disclosure.

FIG. 10 is a flowchart for explaining a method for manufacturing an interposer included in an electronic device according to an embodiment of the disclosure.

Figure 11:
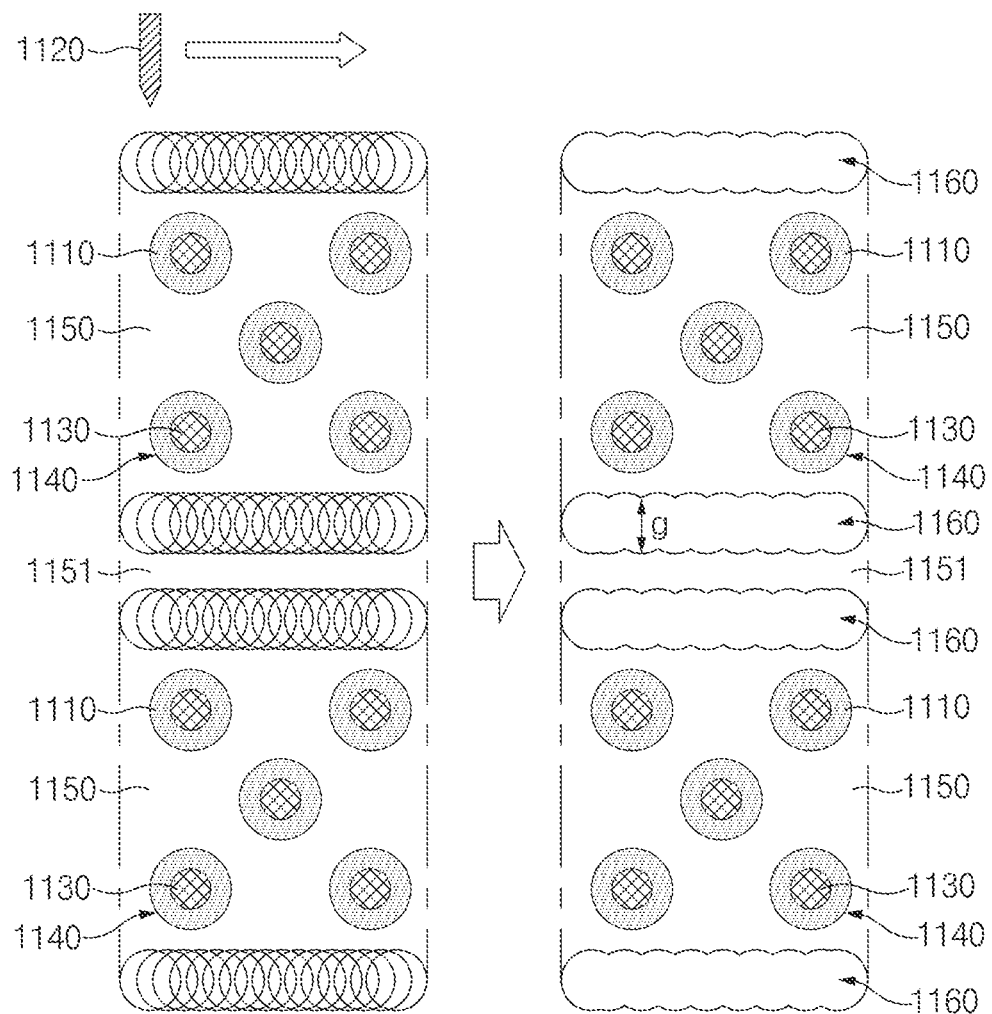
FIG. 11 is a view for explaining a secondary drilling process of FIG. 10 according to an embodiment of the disclosure.

FIG. 11 is a view for explaining a secondary drilling process illustrated FIG. 10 in detail according to an embodiment of the disclosure.

Referring to FIGS. 10 and 11, in operation 1001, through a primary drilling process, a plurality of via holes 1140 (e.g., the via holes 640 of FIGS. 6 and 7) may be formed in a disk 1151. The via holes 1140 may pass through the disk 1151, starting from a first surface to a second surface thereof, by using a drill bit. When sizes of the via holes 1140 are different, a plurality of drills having different sizes may be used.

In operation 1002, through a primary plating process, conductive vias 1110 (e.g., the conductive vias 610 of FIGS. 6 and 7) may be formed in the disk 1151 exposed through the plurality of via holes 1140. The conductive vias 1110 may be formed on a side surface of the disk 1151, exposed through the via holes 1140 formed in the disk 1151, to have a specific thickness. The conductive vias 1110 may be formed not to fully fill the via holes 1140. After the primary plating process, a primary polishing process may be performed. The conductive vias 1110 may be disposed in the via holes 1140 by removing the conductive vias 110 disposed on the first surface and the second surface of the disk 1151 through the polishing process. The conductive vias 1110 may define substantially the same horizontal plane as the first surface and the second surface of the disk 1151 while not protruding further than the first surface and the second surface of the disk 1151.

In operation 1003, the conductive vias 1110 and the filler members 1130 (e.g., the filler members 630 of FIGS. 6 and 7) may be formed through a hole plugging process. The filler members 1130 may be formed by filling an insulating material or a conductive material in a liquid state in the conductive vias 1110 and hardening the insulating material or the conductive material. After the hole plugging process, a secondary polishing process may be performed. The filler members 1130 may define substantially the same horizontal plane as the first surface and the second surface of the disk 1151 by removing portions of the filler members 1130, which protrude further than the first surface and the second surface of the disk 1151 through the secondary polishing process. According to another embodiment, the primary polishing process may be omitted and only the secondary polishing process may be performed. After the hole plugging process, the conductive vias 1110 and the filler members 1130 may be polished together through one secondary polishing process.

In operation 1004, through the secondary drilling process, the disk 1151, in which the filler members 1130 and the conductive vias 1110 are formed in the via holes 1140, may be machined to a size of a product. The disk 1151 may be machined to a plurality of dielectric boards 1150 connected to each other through the bridge (e.g., the bridge 960 of FIG. 8). During the secondary drilling process, a drill bit 1120 for a slot may be used. For example, during the secondary drilling process, the drill bit 1120 of about 0.4π to about 1.0π may be used. When the drill bit of less than about 0.4π is used, the drill bit may be easily broken and productivity may be lowered as machining time increases. When the drill bit of more than about 1.07π is used, a width of a slit space 1160 is widened so that it may be difficult to increase the number of finished products.

Through the secondary drilling process, a slit space 1160 having a width "g" of a maximum of about 0.5 mm may be formed in the disk 1151 along an external appearance of the dielectric board 1150. The width "g" of the slit space 1160 formed through the secondary drilling process may become smaller than a width of a slit space formed through a router process.

According to various embodiments, the drill bit 1120 used during the secondary drilling process and the drill bit used during the primary drilling process may be the same or different. When the drill bit 1120 used during the secondary drilling process and the drill bit used during the primary drilling process are different, the secondary drilling process may be performed after the drill bit 1120 is replaced after the primary drilling process.

In operation 1005, through the secondary plating process, a plating layer may be formed on the inner surface (e.g., the inner surface 664 of FIGS. 6 and 7) and the outer surface (e.g., the outer surface 663 of FIGS. 6 and 7) of each of the plurality of dielectric boards 1150, and the first surface (e.g., the first surface 661 of FIGS. 6 and 7) and the second surface (e.g., the second surface 662 of FIGS. 6 and 7) of the dielectric board 1150.

In operation 1006, by patterning the plating layer through a patterning process, the side conductive member (e.g., the side conductive member 620 of FIGS. 6 and 7), the first pad member (e.g., the first pad member 622 of FIGS. 6 and 7), and the second pad member (e.g., the second pad member 623 of FIGS. 6 and 7) may be formed. The side conductive member may be formed on at least any one of the inner surface and the outer surface of the dielectric board 1150. The first pad member may be formed to contact the conductive vias 1110 on the first surface of the dielectric board 1150. The second pad member may be formed to contact the conductive vias 1110 on the second surface of the dielectric board 1150.

In operation 1007, through a solder resist process, a solder resist layer (e.g., the solder resist layer 624 of FIG. 7) may be formed by coating a solder resist on an outermost layer of the interposer and patterning the solder resist.

In operation 1008, through a router process, the bridge (e.g., the bridge 960 of FIG. 8) disposed between the dielectric boards 1150 may be removed. As the bridge is removed, an individual interposer may be formed.

According to various embodiments, an interposer 660 including an opening area 680 for accommodating at least one electronic component may include a dielectric board 650 including an inner surface 664 that faces the opening area and an outer surface 663 that faces an opposite direction to the inner surface, wherein the outer surface 663 is formed in a convexo-concave form having a plurality of first concave areas 6631 and a plurality of first convex areas 6632, and a side conductive member 620 disposed on the first concave areas 6631 and the first convex areas 6632 of the outer surface 663, and formed along the convexo-concave form of the outer surface 663.

According to various embodiments, the first concave areas 6631 may be formed to be concave toward the opening area 680, and the first convex areas 6632 may be formed to be convex toward an opposite direction to the opening area 680.

According to various embodiments, the dielectric board 650 includes a first surface 661 and a second surface 662 that face opposite directions, and the side conductive member 620 may be disposed on the outer surface 663, a portion of the first surface 661, and a portion of the second surface 662.

According to various embodiments, the interposer may further include a plurality of via holes 640 that pass through the dielectric board 650, starting from the first surface 661 to the second surface 662 of the dielectric board 650, and a plurality of conductive vias 610 formed in the plurality of via holes 640, respectively.

According to various embodiments, widths of the first concave areas 6631 may be smaller than or equal to diameters of the plurality of via holes 640.

According to various embodiments, the side conductive member 620 formed in the first concave areas 6631 of the outer surface 663 and the conductive vias 610 may be spaced apart from each other by 150 μm to 250 μm.

According to various embodiments, the first concave areas 6631 may be formed between the first convex areas 6632 in an arc shape.

According to various embodiments, the first concave areas 6631 and the first convex areas 6632 may be alternately disposed along any one of a lengthwise direction and a widthwise direction of the outer surface 663.

According to various embodiments, the interposer may further include at least one first planar area 8633 formed at a portion of the outer surface 663.

According to various embodiments, the inner surface 664 may have a convexo-concave form having a plurality of second concave areas 6641 and a plurality of second convex areas 6642, and the side conductive member 620 may be disposed on the second concave areas 6641 and the second convex areas 6642 of the inner surface 664, and may be formed along the convexo-concave form of the inner surface 664.

According to various embodiments, the second convex areas 6642 may be formed to be convex toward the opening area 680, and the second concave areas 6641 may be formed to be concave toward an opposite direction to the opening area 680.

According to various embodiments, widths of the first concave areas 6631 may be the same as widths of the second concave areas 6641.

According to various embodiments, the second concave areas 6641 may be formed between the second convex areas 6642 in an arc shape.

According to various embodiments, the second concave areas 6641 and the second convex areas 6642 may be alternately disposed along any one of a lengthwise direction and a widthwise direction of the inner surface 664.

According to various embodiments, the side conductive member 620 formed in the second concave areas 6641 of the inner surface 664 and the conductive vias 610 may be spaced apart from each other by 150 μm to 250 μm.

According to various embodiments, an electronic device 500 may include a first circuit board 530 and a second circuit board 540 disposed in an interior of the electronic device, at least one electronic component mounted on at least any one of the first circuit board 530 and the second circuit board 540, and an interposer disposed between the first circuit board 530 and the second circuit board 540, and including an opening area 570 and 680 for accommodating the at least one electronic component, and the interposer includes a board including an inner surface 664 that faces the opening area 680 and an outer surface 663 that faces an opposite direction to the inner surface 664, wherein the outer surface 663 is formed in a convexo-concave form having a plurality of first concave areas 6631 and a plurality of first convex areas 6632, and a side conductive member 620 disposed on the first concave areas 6631 and the first convex areas 6632 of the outer surface 663, and formed along the convexo-concave form of the outer surface 663.

According to various embodiments, the first concave areas 6631 may be formed to be concave toward the opening area 680, and the first convex areas 6632 may be formed to be convex toward an opposite direction to the opening area 680.

According to various embodiments, the side conductive member 620 formed in the first concave areas 6631 of the outer surface 663 and the conductive vias 610 may be spaced apart from each other by 150 μm to 250 μm.

According to various embodiments, the inner surface 664 664 may have a convexo-concave form having a plurality of second concave areas 6641 and a plurality of second convex areas 6642, and the side conductive member 620 may be disposed on the second concave areas 6641 and the second convex areas 6642 of the inner surface 664, and is formed along the convexo-concave form of the inner surface 664, the second convex areas 6642 may be formed to be convex toward the opening area 680, and the second concave areas 6641 may be formed to be concave toward an opposite direction to the opening area 680.

According to various embodiments, the side conductive member 620 formed in the second concave areas 6641 of the inner surface 664 and the conductive vias 610 may be spaced apart from each other by 150 μm to 250 μm.

The various embodiments of the disclosure and the terms used herein do not limit the technology described in the disclosure to specific forms, and should be construed to include various modifications, equivalents, and/or replacements of the embodiments. With regard to description of drawings, similar components may be marked by similar reference numerals. In the disclosure disclosed herein, the expressions "A or B," or "at least one of A or/and B," "A, B, or C," or "at least one of A, B, or/and C," and the like used herein may include any and all combinations of one or more of the associated listed items. The terms, such as "first," "second," and the like used herein may refer to various elements of various embodiments of the disclosure, but do not limit the elements. For example, such terms are used only to distinguish an element from another element and do not limit the order and/or priority of the elements. If it is mentioned that an element (e.g., a first element) is (functionally or communicatively) "connected" to another element (e.g., a second element), the first element may be directly connected to the second element or may be connected to the second element through another element (e.g., a third element).

In the disclosure, the expression "configured to" may be interchangeably used with, for example, "suitable for," "capable of," "modified to," "made to," "able to," or "designed to" according to a situation in a hardware or software way. In some situations, the expression "a device configured to" may mean that the device is "capable of" operating together with another device or other components. CPU, for example, a "processor configured to (or set to) perform A, B, and C" may mean a dedicated processor (e.g., an embedded processor) for performing a corresponding operation or a generic-purpose processor (e.g., a central processing unit (CPU) or an application processor) which may perform corresponding operations by executing one or more programs which are stored in a memory device.

The term "module" used in the disclosure may include a unit configured in a hardware, software, or firmware way, and for example, may be used interchangeably with the terms such as logic, a logic block, a component, or a circuit. The "module" may be an integral component, or a minimum unit or a part which performs one or more functions. The "module" may be implemented mechanically or electronically, and for example, may include an application-specific integrated circuit (ASIC) chip, field-programmable gate arrays (FPGAs), or a programmable logic device that is known or to be developed in the future, which performs some operations.

At least some of the devices (e.g., modules or functions) or methods (e.g., operations) according to various embodiments of the disclosure may be implemented by an instruction stored in a computer-readable storage medium (e.g., the memory 730), for example, in the form of a program module. When the instruction is executed by the processor (for example, the processor), the at least one processor may perform a function corresponding to the instruction. The computer-readable recording medium may include a hard disk, a floppy disk, a magnetic medium (e.g., a magnetic tape), an optical recording medium (e.g., a compact disc read only memory (CD-ROM) or a digital versatile disc (DVD)), a magneto-optical medium (e.g., a floptical disk), and an embedded memory. The instruction may include a code made by a compiler or a code that may be executed by an interpreter.

Each of the elements (e.g., a module or a program) according to various embodiments may include a single or a plurality of entities, and some of the corresponding sub-elements may be omitted or another sub-element may be further included in various embodiments. Alternatively or additionally, some elements (e.g., a module or a program module) may be integrated into one entity to perform functions performed by the corresponding elements before the integration in the same way or similarly. The operations performed by a module, a program module, or another element according to various embodiments may be executed sequentially, in parallel, repeatedly, or heuristically, or at least some operations may be executed in another sequence or may be omitted, or another operation may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An interposer including an opening area for accommodating at least one electronic component, the interposer comprising:
    a board including a first surface and a second surface that face opposite directions, an inner surface that faces the opening area, and an outer surface that faces an opposite direction to the inner surface,
    wherein the outer surface is formed in a convexo-concave form having a plurality of first concave areas and a plurality of first convex areas; and
    a side conductive member disposed on the first concave areas and the first convex areas of the outer surface, and formed along the convexo-concave form of the outer surface,
    wherein the plurality of first concave areas and the plurality of first convex areas extend from a first corner meeting the first surface to a second corner meeting the second surface, and
    wherein the inner surface has a convexo-concave form having a plurality of second concave areas and a plurality of second convex areas.

2. The interposer of claim 1,
    wherein the first concave areas are formed to be concave toward the opening area, and
    wherein the first convex areas are formed to be convex toward an opposite direction to the opening area.

3. The interposer of claim 1,
    wherein the side conductive member is disposed on the outer surface, a portion of the first surface, and a portion of the second surface.

4. The interposer of claim 3, further comprising:
    a plurality of via holes that pass through the board, starting from the first surface to the second surface of the board; and
    a plurality of conductive vias formed in the plurality of via holes, respectively.

5. The interposer of claim 4, wherein widths of the first concave areas are smaller than or equal to diameters of the plurality of via holes.

6. The interposer of claim 4, wherein the side conductive member formed in the first concave areas of the outer surface and the conductive vias are spaced apart from each other by 150 μm to 250 μm.

7. The interposer of claim 1, wherein the first concave areas are formed between the first convex areas in an arc shape.

8. The interposer of claim 1, wherein the first concave areas and the first convex areas are alternately disposed along at least one of a lengthwise direction or a widthwise direction of the outer surface.

9. The interposer of claim 1, further comprising:
at least one planar area formed at a portion of the outer surface.

10. The interposer of claim 4,
wherein the side conductive member is disposed on the second concave areas and the second convex areas of the inner surface, and
wherein the side conductive member is formed along the convexo-concave form of the inner surface.

11. The interposer of claim 10,
wherein the second convex areas are formed to be convex toward the opening area, and
wherein the second concave areas are formed to be concave toward an opposite direction to the opening area.

12. The interposer of claim 10, wherein widths of the first concave areas are a same as widths of the second concave areas.

13. The interposer of claim 10, wherein the second concave areas are formed between the second convex areas in an arc shape.

14. The interposer of claim 10, wherein the second concave areas and the second convex areas are alternately disposed along at least one of a lengthwise direction or a widthwise direction of the inner surface.

15. The interposer of claim 10, wherein the side conductive member formed in the second concave areas of the inner surface and the conductive vias are spaced apart from each other by 150 μm to 250 μm.

16. An electronic device comprising:
a first circuit board and a second circuit board disposed in an interior of the electronic device;
at least one electronic component mounted on at least any one of the first circuit board or the second circuit board; and
an interposer disposed between the first circuit board and the second circuit board, and including an opening area for accommodating the at least one electronic component,
wherein the interposer comprises:
a board including a first surface and a second surface that face opposite directions, an inner surface that faces the opening area, and an outer surface that faces an opposite direction to the inner surface, wherein the outer surface is formed in a convexo-concave form having a plurality of first concave areas and a plurality of first convex areas and the inner surface has a convexo-concave form having a plurality of second concave areas and a plurality of second convex areas, and
a side conductive member disposed on the first concave areas and the first convex areas of the outer surface, and formed along the convexo-concave form of the outer surface,
wherein the plurality of first concave areas and the plurality of first convex areas extend from a first corner meeting the first surface to a second corner meeting the second surface.

17. The electronic device of claim 16,
wherein the first concave areas are formed to be concave toward the opening area, and
wherein the first convex areas are formed to be convex toward an opposite direction to the opening area.

18. The electronic device of claim 16,
wherein the interposer comprises:
a plurality of via holes that pass through the board, starting from the first surface to the second surface of the board, and
a plurality of conductive vias formed in the plurality of via holes, respectively, and
wherein the side conductive member formed in the first concave areas of the outer surface and the conductive vias are spaced apart from each other by 150 μm to 250 μm.

19. The electronic device of claim 18,
wherein the side conductive member is disposed on the second concave areas and the second convex areas of the inner surface,
wherein the side conductive member is formed along the convexo-concave form of the inner surface,
wherein the second convex areas are formed to be convex toward the opening area, and
wherein the second concave areas are formed to be concave toward an opposite direction to the opening area.

20. The electronic device of claim 19, wherein the side conductive member formed in the second concave areas of the inner surface and the conductive vias are spaced apart from each other by 150 μm to 250 μm.

* * * * *